(12) United States Patent
Tanaka et al.

(10) Patent No.: US 9,788,415 B2
(45) Date of Patent: Oct. 10, 2017

(54) CIRCUIT BOARD, ELECTRONIC DEVICE, AND METHOD OF MANUFACTURING CIRCUIT BOARD

(71) Applicant: FUJITSU LIMITED, Kawasaki-shi, Kanagawa (JP)

(72) Inventors: Megumi Tanaka, Kawasaki (JP); Daisuke Usui, Cupertino, CA (US)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/096,680

(22) Filed: Apr. 12, 2016

(65) Prior Publication Data

US 2016/0338191 A1    Nov. 17, 2016

(30) Foreign Application Priority Data

May 13, 2015   (JP) ................. 2015-098135

(51) Int. Cl.

| | |
|---|---|
| *H05K 1/02* | (2006.01) |
| *H05K 3/00* | (2006.01) |
| *H01R 12/71* | (2011.01) |
| *H05K 1/11* | (2006.01) |
| *H01R 12/58* | (2011.01) |
| *H01R 12/70* | (2011.01) |
| *H01R 12/73* | (2011.01) |

(52) U.S. Cl.
CPC ......... *H05K 1/0251* (2013.01); *H01R 12/585* (2013.01); *H05K 1/115* (2013.01); *H05K 3/0047* (2013.01); *H01R 12/7082* (2013.01); *H01R 12/737* (2013.01); *H05K 2201/10303* (2013.01); *H05K 2203/0207* (2013.01)

(58) Field of Classification Search
CPC ........ H05K 1/117; H05K 1/115; H05K 1/116; H05K 1/14; H05K 1/182; H05K 1/184; H05K 1/0251; H01R 12/585; H01R 12/58
See application file for complete search history.

(56) References Cited

U.S. PATENT DOCUMENTS

| | | | |
|---|---|---|---|
| 6,747,862 B1 | 6/2004 | Skeoch | |
| 7,833,026 B1 * | 11/2010 | Morgan | ................. H01R 12/52 439/108 |
| 2008/0217052 A1 * | 9/2008 | Matsui | ................. H05K 1/0268 174/266 |

(Continued)

FOREIGN PATENT DOCUMENTS

| | | |
|---|---|---|
| JP | 2002-110274 | 4/2002 |
| JP | 2010-537402 | 12/2010 |
| JP | 2012-248653 | 12/2012 |

*Primary Examiner* — Timothy Thompson
*Assistant Examiner* — Amol Patel
(74) *Attorney, Agent, or Firm* — Staas & Halsey LLP

(57) ABSTRACT

A circuit board includes: a first surface and a second surface opposite to the first surface; a through hole extending between the first surface and the second surface; a conductor covering an inner wall surface of the through hole, a first end and a second end of the conductor being terminated inside the through hole; and a wire connected to the conductor, wherein a sum of a length from a contact portion where the conductor contacts a connector pin inserted in the through hole to the first end of the conductor, and a length from a wire connecting portion where the conductor is connected to the wire to the second end of the conductor is 0.5 mm or less.

10 Claims, 22 Drawing Sheets

(56) References Cited

U.S. PATENT DOCUMENTS

| | | | |
|---|---|---|---|
| 2009/0045889 A1* | 2/2009 | Goergen | H05K 1/0216 333/175 |
| 2009/0166080 A1* | 7/2009 | Matsui | H05K 3/4623 174/266 |
| 2009/0173532 A1* | 7/2009 | Sugane | H05K 1/115 174/262 |
| 2012/0167386 A1 | 7/2012 | Goergen et al. | |
| 2012/0302075 A1* | 11/2012 | Muraoka | H05K 1/0251 439/78 |
| 2015/0264804 A1* | 9/2015 | Huang | H05K 1/0216 174/262 |
| 2015/0351240 A1* | 12/2015 | Nabeyama | H05K 1/115 361/760 |
| 2016/0198563 A1* | 7/2016 | Schaefer | H05K 1/0263 174/251 |
| 2016/0323995 A1* | 11/2016 | Yi | H05K 3/429 |

\* cited by examiner

MODEL 1

MODEL 2

MODEL 3

CIRCUIT BOARD, ELECTRONIC DEVICE, AND METHOD OF MANUFACTURING CIRCUIT BOARD

CROSS-REFERENCE TO RELATED APPLICATION

This application is based upon and claims the benefit of priority of the prior Japanese Patent Application No. 2015-098135, filed on May 13, 2015, the entire contents of which are incorporated herein by reference.

FIELD

The embodiments discussed herein are related to a circuit board, an electronic device including the circuit board, and a method of manufacturing the circuit board.

BACKGROUND

As techniques for a circuit board including a wiring layer therein, the following techniques are known. According to one of the known techniques, a through hole formed in a printed circuit board is plated with a conductive material, a conductive pad is formed around the through hole on one surface or both surfaces of the printed circuit board, and the conductive pad outside the through hole on the printed circuit board is removed by back drilling.

Another known technique is to decrease the length of a conductive stub by drilling at least a part of a through hole. Still another known technique is to shorten a stub by making a through hole for a signal pin shorter than another through hole by back drilling.

In order to mechanically and electrically connect a connector to a circuit board, used is a via including a through hole formed in the circuit board and a conductor that covers an inner wall surface of the through hole. More specifically, a connector pin of the connector is inserted into the through hole to contact with the conductor that covers the inner wall surface of the through hole. The conductor that covers the inner wall surface of the through hole is connected to a signal wire formed inside the circuit board, and the signal wire is electrically connected to the connector pin through the via.

A part of the via may form a wire branch called a stub, and may cause a negative effect on a signal flowing in the signal wire. That is, when a signal reaches a branch point of the stub from the signal wire, the signal flowing in the signal wire is divided into two signal components, one of which flows to the stub, is reflected on an end of the stub, and returns to the branch point again. As a result, the signal flowing in the signal wire may attenuate in some cases at the branch point due to interference between the signal flowing in the signal wire and the signal reflected on the stub end.

Back drilling of inserting a drill from a back surface of a circuit board at a position where a via is formed, and cutting and removing a stub is known as a method for removing a stub. However, a reflection loss caused by the stub increases as the signal transmission rate becomes higher, and high-speed transmission exceeding 25 Gbps (bps: bits per second) may not be achieved merely by performing the conventional back drilling.

The followings are reference documents.
  [Document 1] Japanese Laid-open Patent Publication No. 2002-110274,
  [Document 2] Japanese Laid-open Patent Publication No. 2012-248653, and
  [Document 3] Japanese National publication of International Patent Application No. 2010-537402.

SUMMARY

According to an aspect of the invention, a circuit board includes: a first surface and a second surface opposite to the first surface; a through hole extending between the first surface and the second surface; a conductor covering an inner wall surface of the through hole, a first end and a second end of the conductor being terminated inside the through hole; and a wire connected to the conductor, wherein a sum of a length from a contact portion where the conductor contacts a connector pin inserted in the through hole to the first end of the conductor, and a length from a wire connecting portion where the conductor is connected to the wire to the second end of the conductor is 0.5 mm or less.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
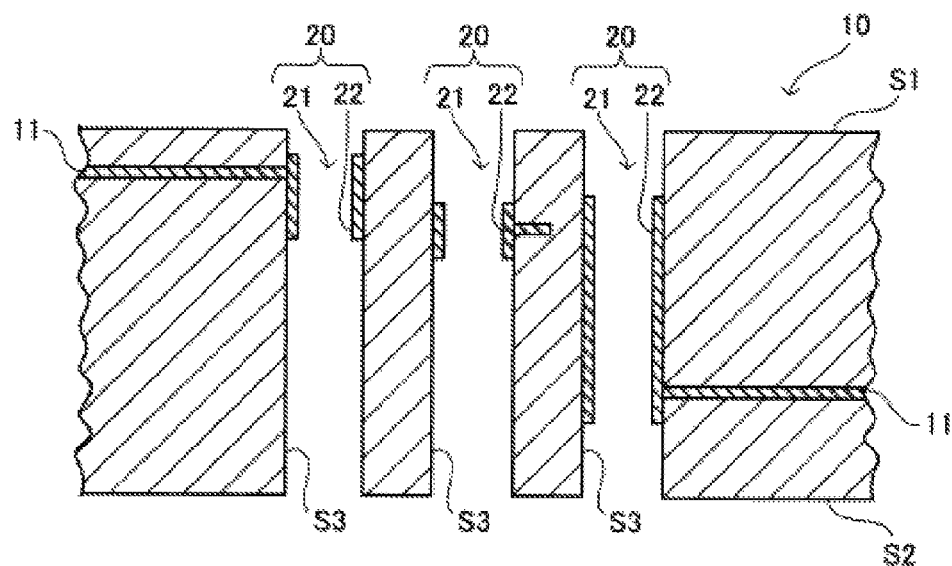
FIG. 1A is a sectional view illustrating partial configuration of a circuit board according to an embodiment of a disclosed technique.

Examples of embodiments of a disclosed technique will be described below with reference to the drawings. The same or equivalent constituents in the drawings are given the same reference numerals, and redundant description thereof is omitted as appropriate.

Figure 1B:
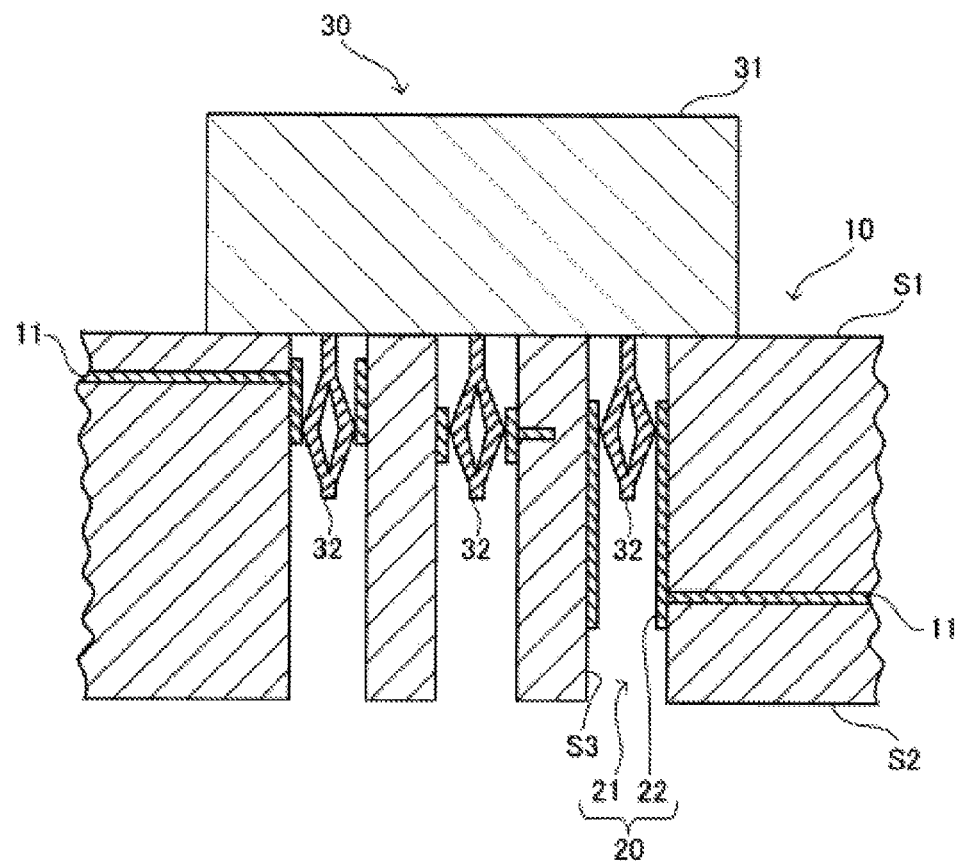
FIG. 1B is a sectional view illustrating partial configuration of the circuit board according to the embodiment of the disclosed technique.

FIGS. 1A and 1B are sectional views illustrating partial configuration of a circuit board 10 according to an embodiment of the disclosed technique. FIG. 1B illustrates the circuit board 10 and a connector 30 mounted on one surface S1 of the circuit board 10. The surface S1 of the circuit board 10, on which the connector 30 is mounted is referred to as the mounting surface S1.

The circuit board 10 has a laminated structure formed by laminating wiring layers and insulator layers. The circuit board 10 has vias 20 each including a through hole 21 extending through the circuit board 10 between the mounting surface S1 and a surface S2 opposite to the mounting surface S1, and a conductor 22 that covers an inner wall surface S3 of the through hole 21. The surface S2 opposite to the mounting surface S1 is hereinafter referred to as the back surface S2. A wire 11 formed in the circuit board 10 is exposed to the inner wall surface S3 of the through hole 21, and is electrically connected to the conductor 22 that covers the inner wall surface S3 of the through hole 21.

The connector 30 is used as a connecter to detachably connect the circuit board 10 to another electronic component electrically and mechanically. The connector 30 includes a socket 31 engaged with a mating connector (not illustrated) and multiple connector pins 32 protruding from the socket 31. The connector 30 is mechanically connected to the circuit board 10 by inserting the connector pins 32 into the respective through holes 21. The connector 30 is electrically connected to the wire 11 in the circuit board 10 by the connector pins 32 being in contact with the conductors 22 of the respective through holes 21.

Figure 2:
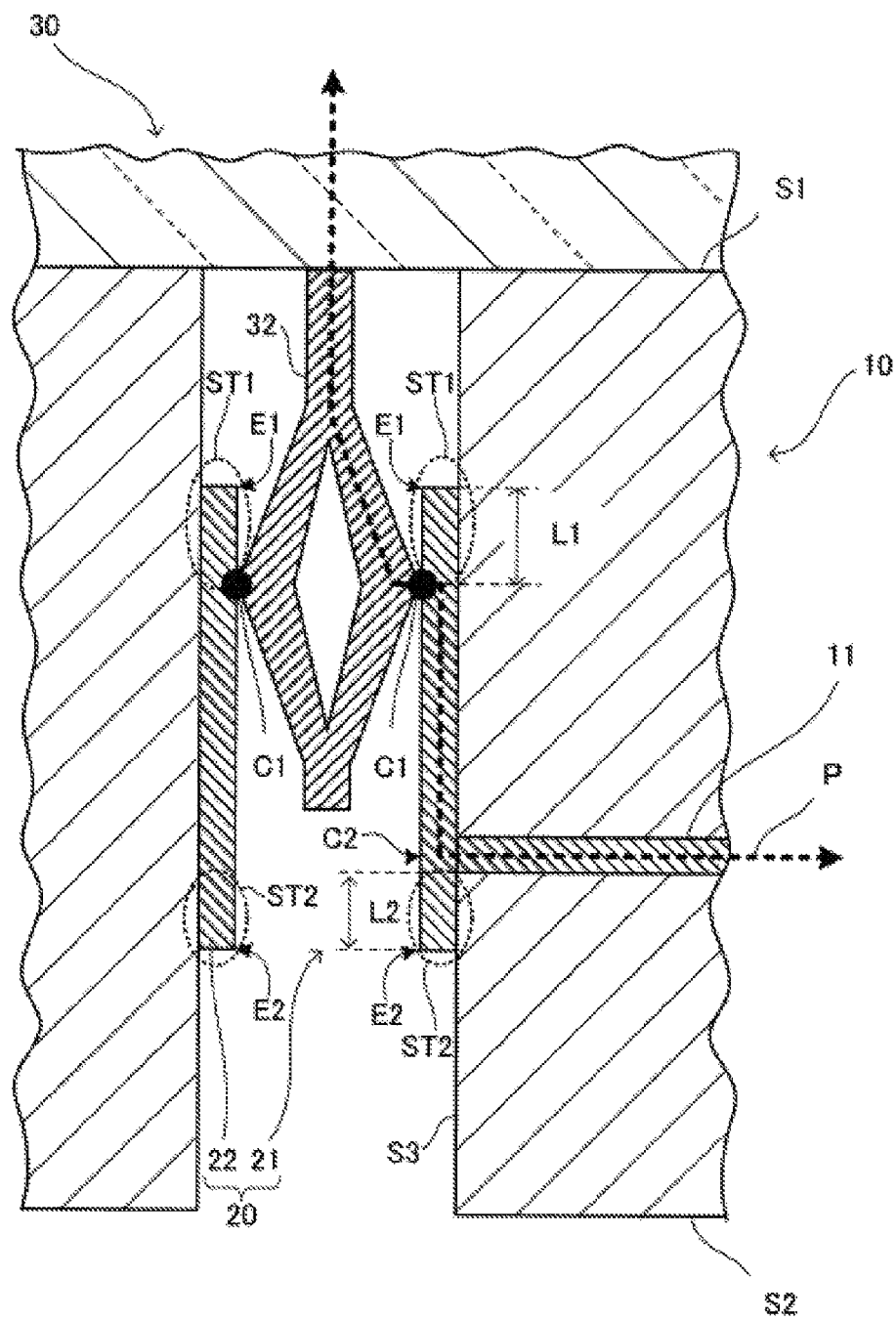
FIG. 2 is a sectional view illustrating the vicinity of a via of the circuit board according to the embodiment of the disclosed technique.
Figure 3:
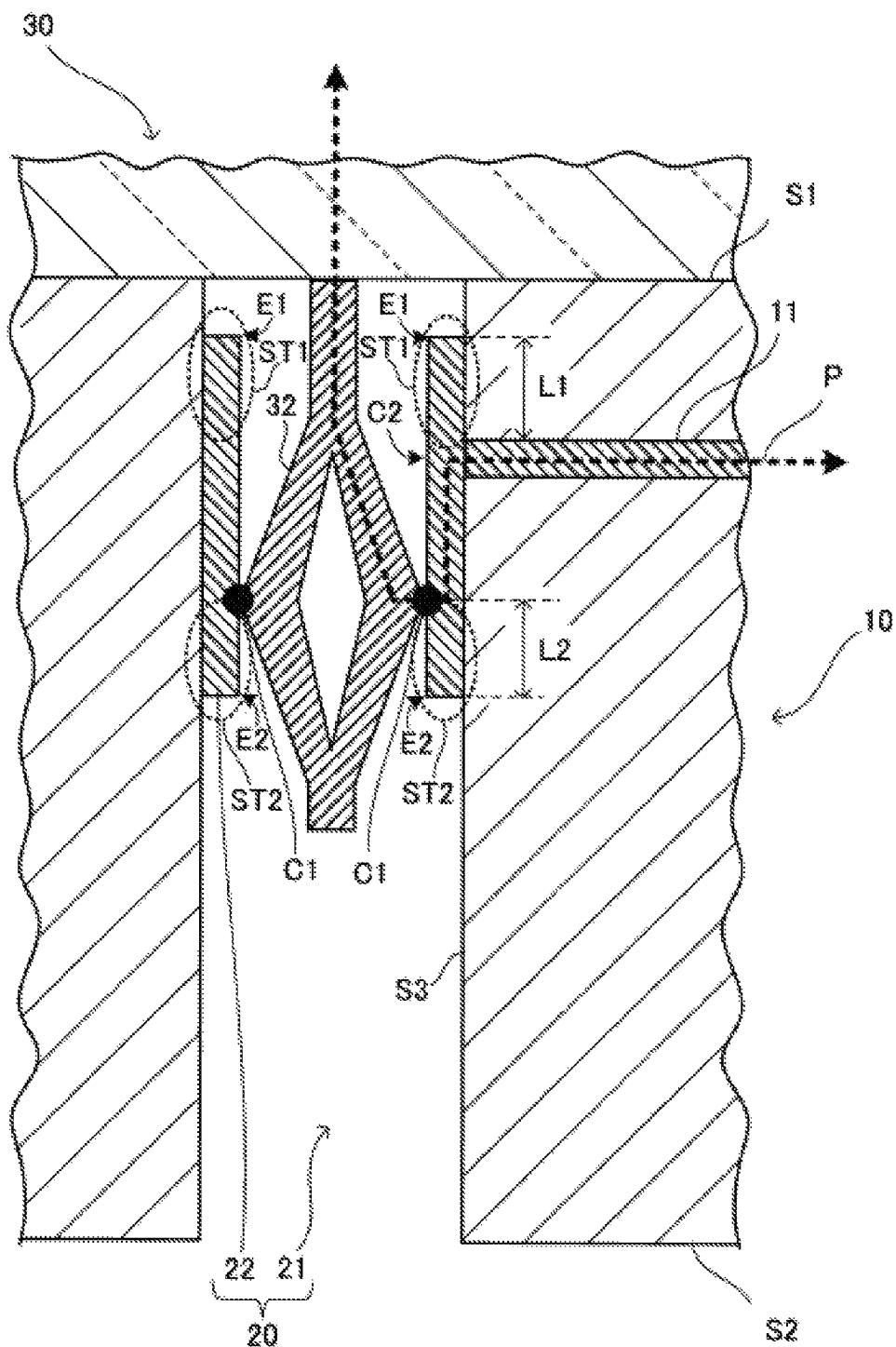
FIG. 3 is a sectional view illustrating the vicinity of the via of the circuit board according to the embodiment of the disclosed technique.
Figure 4:
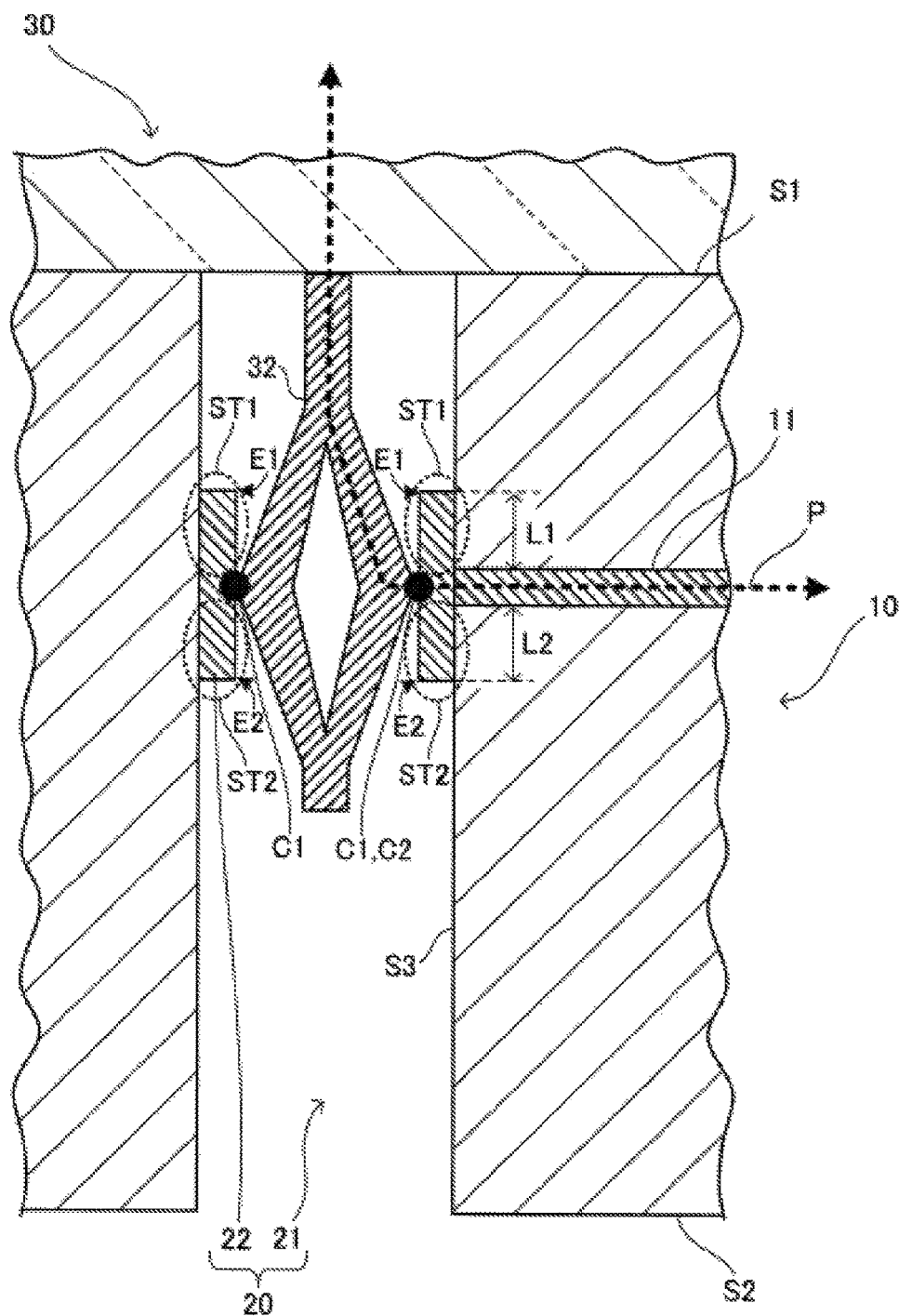
FIG. 4 is a sectional view illustrating the vicinity of the via of the circuit board according to the embodiment of the disclosed technique.

FIGS. 2 to 4 are sectional views illustrating the vicinity of the via 20 of the circuit board 10 in the state where the connector pin 32 is inserted. As illustrated in FIGS. 2 to 4, the connector pin 32 is in contact with the conductor 22 inside of the through hole 21 at contact portions C1. The wire 11 is connected to the conductor 22 inside of the through hole 21 at a wire connecting portion C2. FIG. 2 illustrates the case where the wire connecting portion C2 is formed closer to the back surface S2 than the contact portions C1 are, and FIG. 3 illustrates the case where the wire connecting portion C2 is formed closer to the mounting surface S1 than the contact portions C1 are. FIG. 4 illustrates the case where the contact portions C1 and the wire connecting portion C2 are located at the same position in a depth direction of the through hole 21, which is a direction crossing the mounting surface S1 and the back surface S2.

As illustrated in FIGS. 2 to 4, an end E1 near the mounting surface S1 and an end E2 near the back surface S2 of the conductor 22 in the depth direction of the through hole 21 both are located inside the through hole 21. That is, the ends E1 and E2 of the conductor 22 are away from the mounting surface S1 and the back surface S2, and are disposed between the mounting surface S1 and the back surface S2 in the depth direction of the through hole 21.

A signal transmitted to the circuit board 10 is transmitted along a signal transmission path P represented by a broken arrow in FIGS. 2 to 4. That is, the signal transmitted to the circuit board 10 passes through the connector pin 32, the contact portions C1, the conductor 22, the wire connecting portion C2, and the wire 11.

A portion of the conductor 22, which extends from the signal transmission path P, inside of the through hole 21 is a so-called stub. That is, in the configuration illustrated in FIG. 2, a portion of the conductor 22, which extends between the contact portions C1 and the end E1 near the mounting surface S1, is a stub ST1 near the mounting surface S1. A portion of the conductor 22, which extends between the wire connecting portion C2 and the end E2 near the back surface S2, is a stub ST2 near the back surface S2. Similarly, in the configuration illustrated in FIG. 3, a portion of the conductor 22, which extends between the wire connecting portion C2 and the end E1 near the mounting surface S1, is the stub ST1 near the mounting surface S1. A portion of the conductor 22, which extends between the contact portions C1 and the end E2 near the back surface S2, is the stub ST2 near the back surface S2. Similarly, in the configuration illustrated in FIG. 4, a portion of the conductor 22, which extends between the contact portions C1 and wire connecting portion C2 and the end E1 near the mounting surface S1, is the stub ST1 near the mounting surface S1. A portion of the conductor 22, which extends between the contact portions C1 and wire connecting portion C2 and the end E2 near the back surface S2, is the stub ST2 near the back surface S2.

As compared to the case of removing only the stub ST2 of the conductor 22 near the back surface S2 by back drilling, the stub length may be decreased with the ends E1 and E2 of the conductor 22 disposed inside of the through hole 21. This may suppress a reflection loss. In the circuit board 10 in this embodiment, a sum of a length L1 of the stub ST1 near the mounting surface S1 and a length L2 of the stub ST2 near the back surface S2 (L1+L2) is set to 0.5 mm or less. In other words, a sum of a length from the contact portions C1 to one end of the conductor 22 and a length from the wire connecting portion C2 to the other end of the conductor 22 is set to 0.5 mm or less. Hereinafter, the sum of the length L1 of the stub ST1 near the mounting surface S1 and the length L2 of the stub ST2 near the back surface S2 (L1+L2) is referred to as total stub length. By setting the total stub length in each of the vias 20 to 0.5 mm or less in this manner, high-speed transmission exceeding 25 Gbps, for example, may be achieved as described below. In the configuration illustrated in FIG. 4, since the contact portions C1 and the wire connecting portion C2 are disposed at the same position in the depth direction of the through hole 21, the length of the signal transmission path may be minimized, and degradation of transmission performance may be suppressed.

When the circuit board is manufactured according to a manufacturing method described below, as compared to the case where the contact portions C1 and the wire connecting portion C2 are disposed at different positions in the depth direction of the through hole 21 as in the configuration illustrated in FIG. 2 or FIG. 3, the total stub length may be reduced more readily. In the configuration illustrated in FIG. 4, the length L1 from the contact portions C1 and the wire connecting portion C2 to the end E1 of the conductor 22 near the mounting surface S1 may be the same as the length L2 from the contact portions C1 and the wire connecting portion C2 to the end E2 of the conductor 22 near the back surface S2.

The circuit board 10 is an example of a circuit board according to the disclosed technique. The mounting surface S1 and the back surface S2 are examples of a first surface and a second surface according to the disclosed technique. The through hole 21 is an example of a through hole according to the disclosed technique. The conductor 22 is an example of a conductor according to the disclosed technique. The wire 11 is an example of a wire according to the disclosed technique. The contact portion C1 is an example of a contact portion according to the disclosed technique. The wire connecting portion C2 is an example of a wire connecting portion according to the disclosed technique. The connector pins 32 are an example of connector pins according to the disclosed technique.

A method of manufacturing the circuit board 10 according to an embodiment of the disclosed technique will be described below. FIGS. 5A to 5C, 6A, and 6B are sectional views illustrating an example of the method of manufacturing the circuit board 10 according to the embodiment of the disclosed technique. The case where the wire connecting portion C2 is disposed closer to the back surface S2 than the contact portions C1 as illustrated in FIG. 2 will be described below.

Figure 5A:
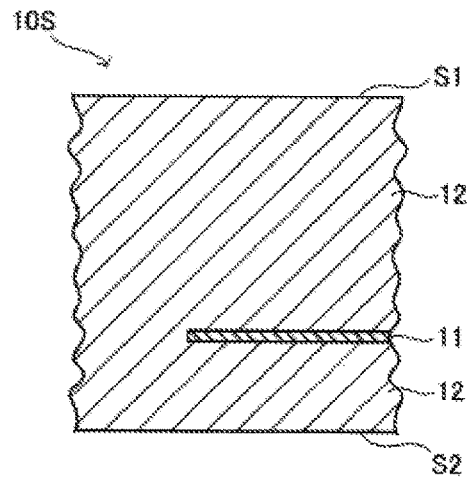
FIG. 5A is a sectional view illustrating an example of a method of manufacturing the circuit board according to an embodiment of the disclosed technique.

First, a laminated board 10S is formed by laminating a wiring layer having the wire 11 and an insulator layer 12 (FIG. 5A). Although FIG. 5A illustrates the wire 11 formed in a single wiring layer, the wire may be formed in multiple wiring layers. The laminated board 10S may be formed in a following manner, for example. That is, a base formed of an insulator having both surfaces coated with a copper foil is prepared. Next, the copper foils are subjected to a desired patterning using a known photolithography technique to form the wire 11 and so on. The same processing is repeated to produce multiple bases each having a wire pattern. Examples of the base include a glass epoxy board formed by impregnating a laminated body of glass-fiber cloth with epoxy resin. Next, the multiple bases having the wiring pattern are adhered to each other with an insulator adhesive layer using prepreg or the like interposed therebetween. The laminated board 10S in which the wiring layer and the insulator layer are alternately laminated is thus produced.

Figure 5B:
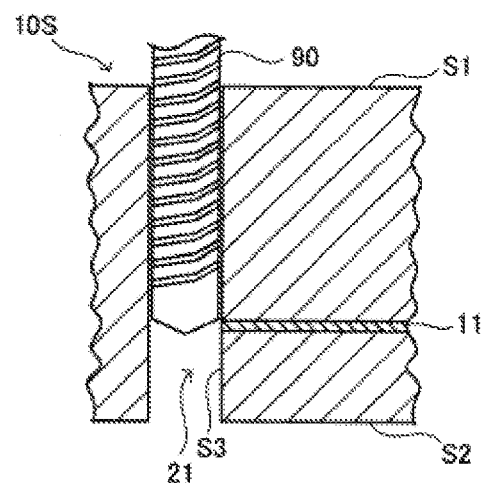
FIG. 5B is a sectional view illustrating the example of the method of manufacturing the circuit board according to the embodiment of the disclosed technique.

Next, the through hole 21 that extends between the mounting surface S1 and the back surface S2 is formed at a predetermined position of the laminated board 10S by using a drill 90. The wire 11 is exposed to the inner wall surface S3 of the through hole 21 (FIG. 5B).

Figure 5C:
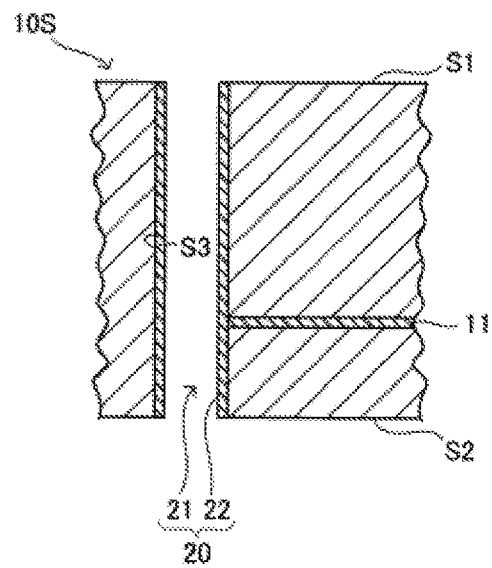
FIG. 5C is a sectional view illustrating the example of the method of manufacturing the circuit board according to the embodiment of the disclosed technique.

Next, the conductor 22 made of copper or the like is formed on the inner wall surface S3 of the through hole 21 using a known plating technique. The inner wall surface S3 of the through hole 21 is covered with the conductor 22, and the wire 11 is connected to the conductor 22 (FIG. 5C).

Figure 6A:
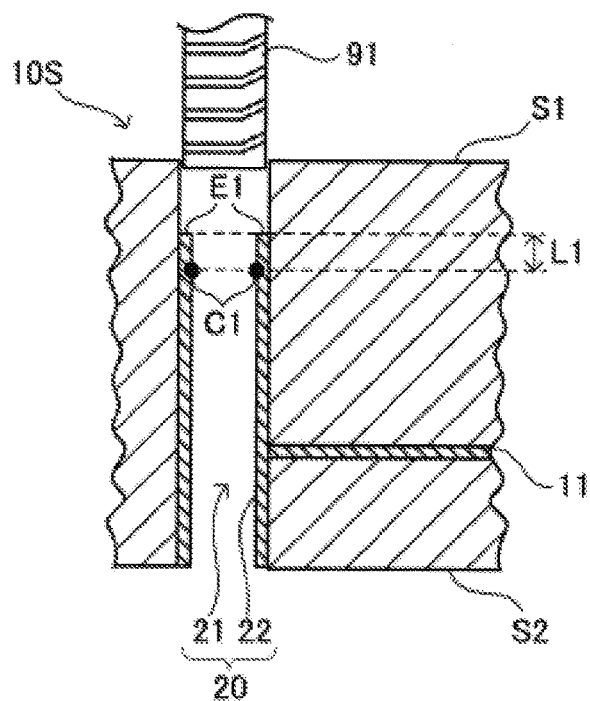
FIG. 6A is a sectional view illustrating the example of the method of manufacturing the circuit board according to the embodiment of the disclosed technique.

Subsequently, an end of the conductor 22 near the mounting surface S1 is removed by upper drilling in which a drill 91 is inserted from the mounting surface S1 side of the laminated board 10S. At this time, the end E1 of the conductor 22 is disposed closer to the mounting surface S1 than the contact portions C1 by controlling the insertion depth of the drill 91 so as not to remove the contact portions C1 where the conductor 22 contacts the contact pin inserted in the through hole 21 from the mounting surface S1 (FIG. 6A).

Figure 6B:
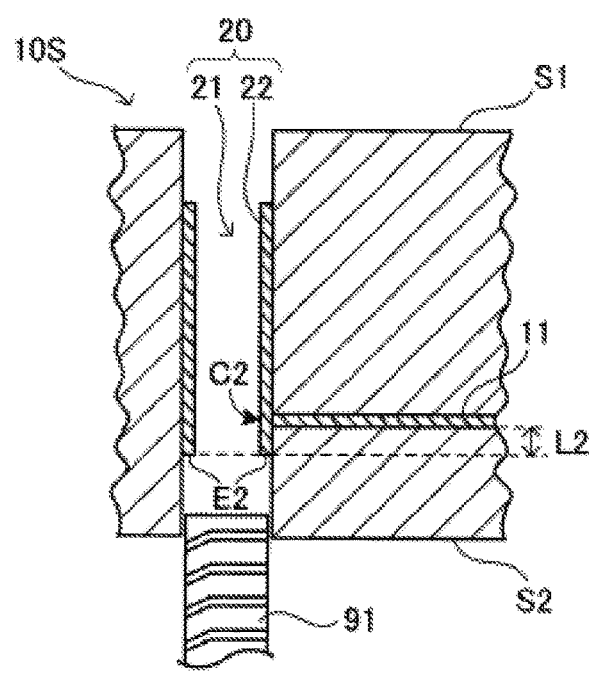
FIG. 6B is a sectional view illustrating the example of the method of manufacturing the circuit board according to the embodiment of the disclosed technique.

Next, an end of the conductor 22 near the back surface S2 is removed by back drilling in which the drill 91 is inserted from the back surface S2 side of the laminated board 10S. At this time, the end E2 of the conductor 22 is disposed closer to the back surface S2 than the wire connecting portion C2 by controlling the insertion depth of the drill 91 so as not to remove the wire connecting portion C2 where the conductor 22 is connected to the wire 11 (FIG. 6B). Further, the insertion depth of the drill 91 is controlled so that a sum of the length L1 between the contact portions C1 and the end E1 of the conductor 22 and the length L2 between the wire connecting portion C2 and the end E2 of the conductor 22 is set to 0.5 mm or less. The back drilling may be performed prior to the upper drilling.

Figure 7:
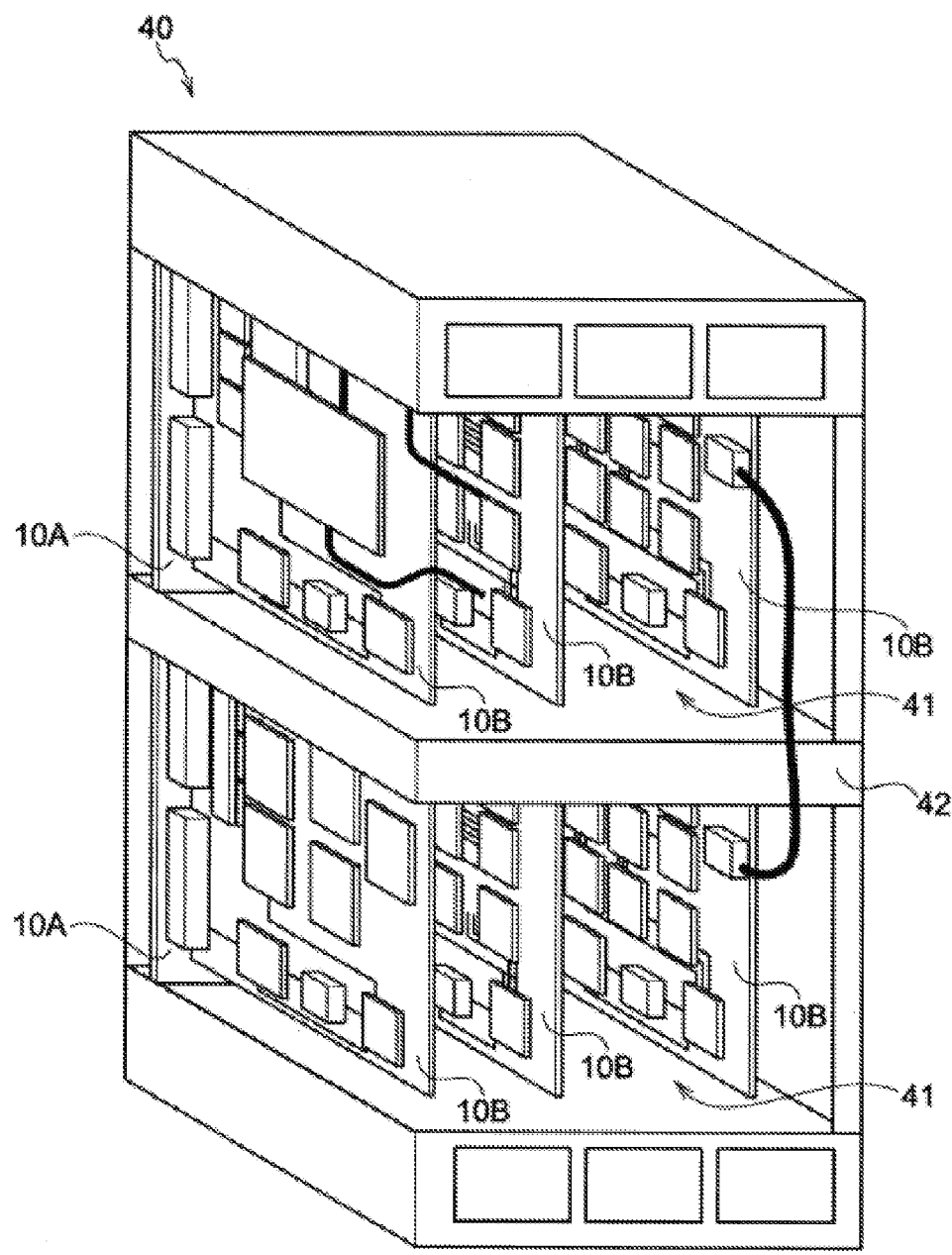
FIG. 7 is a perspective view illustrating an electronic device including multiple circuit boards according to an embodiment of the disclosed technique.

FIG. 7 is a perspective view illustrating an electronic device 40 including the multiple circuit boards 10 according to an embodiment of the disclosed technique. The electronic device 40 may be, for example, an information processor such as a server computer. The electronic device 40 includes multiple electronic units 41 each having one backplane 10A and multiple system boards 10B, and a shelf 42 that stores the multiple electronic units 41. The backplane 10A and the system boards 10B each include the circuit board 10 according to the embodiment of the disclosed technique.

Figure 8:
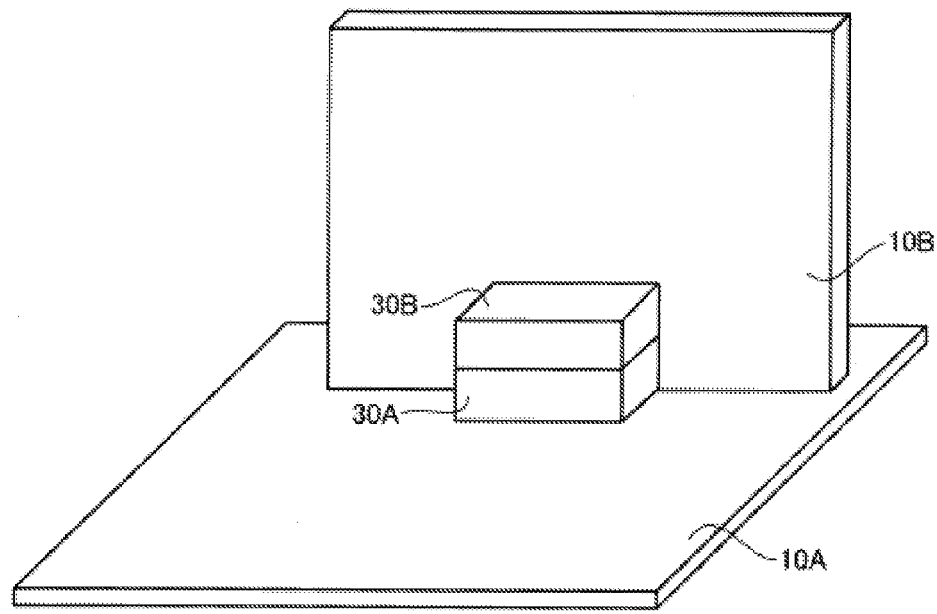
FIG. 8 is a perspective view illustrating an example of a connection between a backplane and a system board according to the embodiment of the disclosed technique.

FIG. 8 is a perspective view illustrating an example of a connection between the backplane 10A and the system board 10B. For simplification, FIG. 8 illustrates only one of the multiple system boards 10B attached to the backplane 10A. A connector 30A is attached to the backplane 10A, and a connector 30B that forms a pair with the connector 30A is attached to the system board 10B. The connector 30A is connected to the connector 30B, thereby electrically and mechanically connecting the backplane 10A to the system board 10B.

Figure 9:
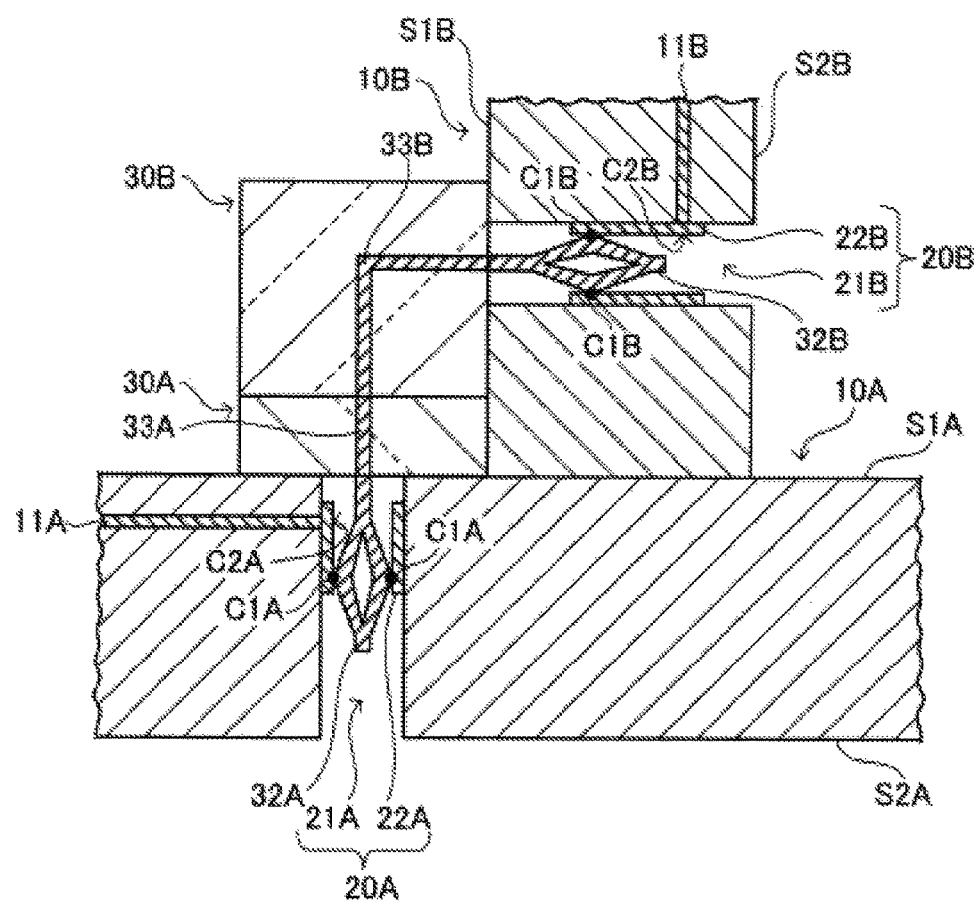
FIG. 9 is a perspective view illustrating details of the connection between the backplane and the system board according to the embodiment of the disclosed technique.

FIG. 9 is a sectional view illustrating details of the connection between the backplane 10A and the system board 10B. The backplane 10A includes a via 20A having a through hole 21A that extends between a mounting surface S1A and a back surface S2A, and a conductor 22A that covers an inner wall surface of the through hole 21A. The backplane 10A also includes a wire 11A connected to the conductor 22A at a wire connecting portion C2A. The connector 30A is mechanically connected to the backplane 10A, and is electrically connected to the wire 11A by inserting a connector pin 32A into the through hole 21A from the mounting surface S1A side. The connector pin 32A is in contact with the conductor 22A at contact portions C1A. Each end of the conductor 22A is located inside of the through hole 21A, and the total stub length is set to 0.5 mm or less. The backplane 10A may have a multilayer wiring structure in which multiple wiring layers including the wiring layer having the wire 11A and multiple insulator layers are included, and the wiring layers and the insulator layers are alternately laminated.

The system board 10B includes a via 20B having a through hole 21B that extends between the mounting surface S1B and the back surface S2B, and a conductor 22B that covers an inner wall surface of the through hole 21B. The system board 10B further includes a wire 11B connected to the conductor 22B at a wire connecting portion C2B. The connector 30B is mechanically connected to the system board 10B and is electrically connected to the wire 11B by inserting a connector pin 32B into the through hole 21B from the mounting surface S1B side. The connector pin 32B is in contact with the conductor 22B at contact portions C1B. Each end of the conductor 22B is located inside of the through hole 21B, and the total stub length is set to 0.5 mm or less. The system board 10B may have a multilayer wiring structure in which multiple wiring layers including the wiring layer having the wire 11B and multiple insulator layers are included, and the wiring layers and the insulator layers are alternately laminated.

For example, the connector 30A and the connector 30B are a pair of fit connectors, and when the connectors are connected to each other, an internal wire 33A of the connector 30A and an internal wire 33B of the connector 30B are connected. Accordingly, the wire 11A of the backplane 10A and the wire 11B of the system board 10B are electrically connected.

A semiconductor device (not illustrated) for transmitting and receiving a signal is, for example, mounted on the system board 10B. The semiconductor device may transmit and receive via the backplane 10A a signal from and to another semiconductor device on another system board 10B attached to the same backplane 10A. A signal transmission mode to be used for a signal transmitted to the backplane 10A and the system boards 10B may be a single-end transmission mode or a differential transmission mode. By setting the total stub length in each of the vias 20A formed in the backplane 10A and the vias 20B formed in the system boards 10B to 0.5 mm or less, the electronic device 40 may support signal transmission of 25 Gbps, for example.

The electronic device 40 is an example of an electronic device of the disclosed technique. The backplane 10A and the system board 10B are examples of a first circuit board and a second circuit board of the disclosed technique.

Figure 10:
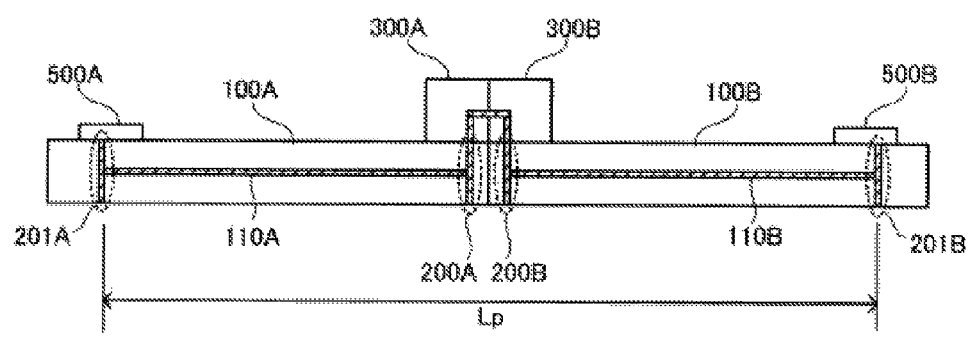
FIG. 10 is a diagram of simulation model for examining relation between stub length and signal transmission performance.

Examination results on relation between the stub length and the signal transmission performance will be described below. FIG. 10 is a diagram of a simulation model for examining the relation between the stub length and the signal transmission performance. Signal transmission performance between a transmitter-receiver 500A mounted on the circuit board 100A and a transmitter-receiver 500B mounted on the circuit board 100B was examined.

The wire 110A, the via 200A, and the via 201A are disposed in the circuit board 100A, and the wire 110B, the via 200B, and the via 201B are disposed in the circuit board 100B. The wire 110A and the wire 110B are connected to each other using the connectors 300A and 300B. The connector 300A is connected to the wire 110A through the via 200A, and the connector 300B is connected to the wire 110B through the via 200B. The transmitter-receiver 500A is connected to the wire 110A through the via 201A, and the transmitter-receiver 500B is connected to the wire 110B through the via 201B. A length Lp of a transmission path formed between the transmitter-receiver 500A and the transmitter-receiver 500B is set to 30 cm. Signal transmission in the following three models having different total stub lengths in the vias 200A, 201A, 200B, and 201B was examined. The total stub length in each of the vias 200A, 201A, 200B, and the 201B is set to be identical in the same model.

Figure 11A:
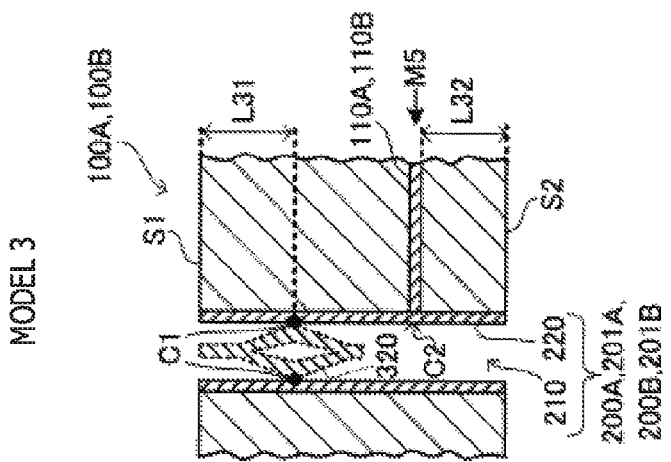
FIG. 11A is a view illustrating configuration of a circuit board in a model 1.
Figure 11B:
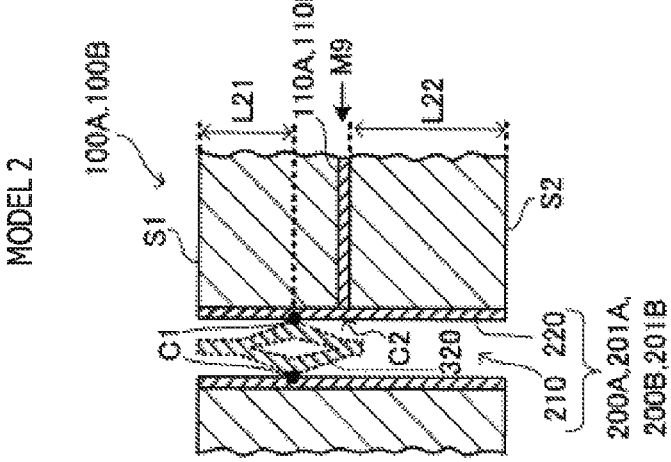
FIG. 11B is a view illustrating configuration of a circuit board in a model 2.
Figure 11C:
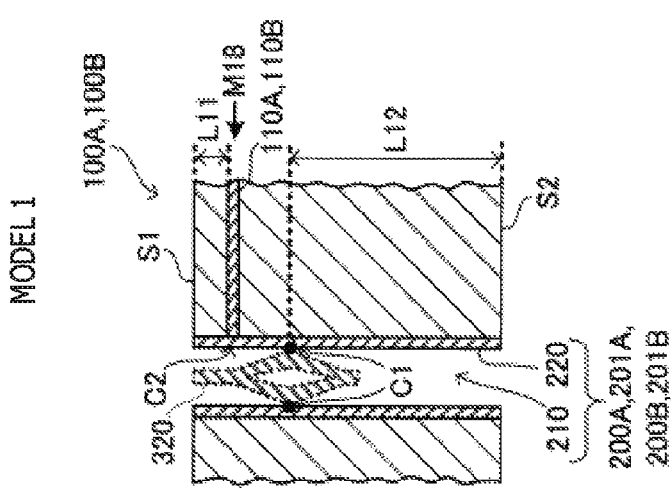
FIG. 11C is a view illustrating configuration of a circuit board in a model 3.

FIGS. 11A, 11B, and 11C are views illustrating the three models. In each of the models, the vias 200A, 201A, 200B, and 201B each include the through hole 210 and the conductor 220. In each of the models, the conductor 220 covers the entire inner wall surface of the through hole 210. That is, one end of the conductor 220 reaches the mounting surface S1, and the other end of the conductor 220 reaches the back surface S2.

In the model 1 illustrated in FIG. 11A, in the circuit board 100A, the wire 110A is disposed in a wiring layer M18 that is an eighteenth wiring layer from the back surface S2, and also in the circuit board 100B, the wire 110B is disposed in the wiring layer M18. In this case, the wires 110A and 110B each are disposed closer to the mounting surface S1 than the contact portions C1 where the conductor 220 contacts the connector pins 320 of the connectors 300A and 300B. In the model 1, a portion of the conductor 220, which extends between the wire connecting portion C2 and the mounting surface S1, is a stub on the mounting surface S1 side, and a length of the portion is set to L11. A portion of the conductor 220, which extends between the contact portions C1 and the back surface S2, is a stub on the back surface S2 side, and a length of the portion is set to L12. In the model 1, the total stub length (L11+L12) of each of the vias 200A, 201A, 200B, and 201B is 2.93 mm.

In the model 2 illustrated in FIG. 11B, in the circuit board 100A, the wire 110A is disposed in a wiring layer M9 that is a ninth wiring layer from the back surface S2, and also in the circuit board 100B, the wire 110B is disposed in the wiring layer M9. In this case, the wires 110A and 110B are disposed closer to the back surface S2 than the contact portions C1 where the conductor 220 contacts the connector pins 320 of the connectors 300A and 300B. In the model 2, a portion of the conductor 220, which extends between the contact portions C1 and the mounting surface S1, is a stub on the mounting surface S1 side, and a length of the portion is set to L21. A portion of the conductor 220, which extends between the wire connecting portion C2 and the back surface S2, is a stub on the back surface S2 side, and a length of the portion is set to L22. In the model 2, the total stub length (L21+L22) of each of the vias 200A, 201A, 200B, and 201B is 2.02 mm.

In the model 3 illustrated in FIG. 11C, in the circuit board 100A, the wire 110A is disposed in a wiring layer M5 that is a fifth wiring layer from the back surface S2, and also in the circuit board 100B, the wire 110B is disposed in the wiring layer M5. In this case, the wires 110A and 110B are disposed closer to the back surface S2 than the contact portions C1 where the conductor 220 contacts the connector pins 320 of the connectors 300A and 300B. In the model 3, a portion of the conductor 220, which extends between the contact portions C1 and the mounting surface S1, is a stub on the mounting surface S1 side, and a length of the portion is set to L31. A portion of the conductor 220, which extends between the wire connecting portion C2 and the back surface S2, is a stub on the back surface S2 side, and a length of the portion is set to L32. In the model 3, the total stub length (L31+L32) of each of the vias 200A, 201A, 200B, and 201B is 1.18 mm. That is, among the three models, the model 1 has the largest total stub length, and the model 3 has the smallest total stub length.

Figure 12:
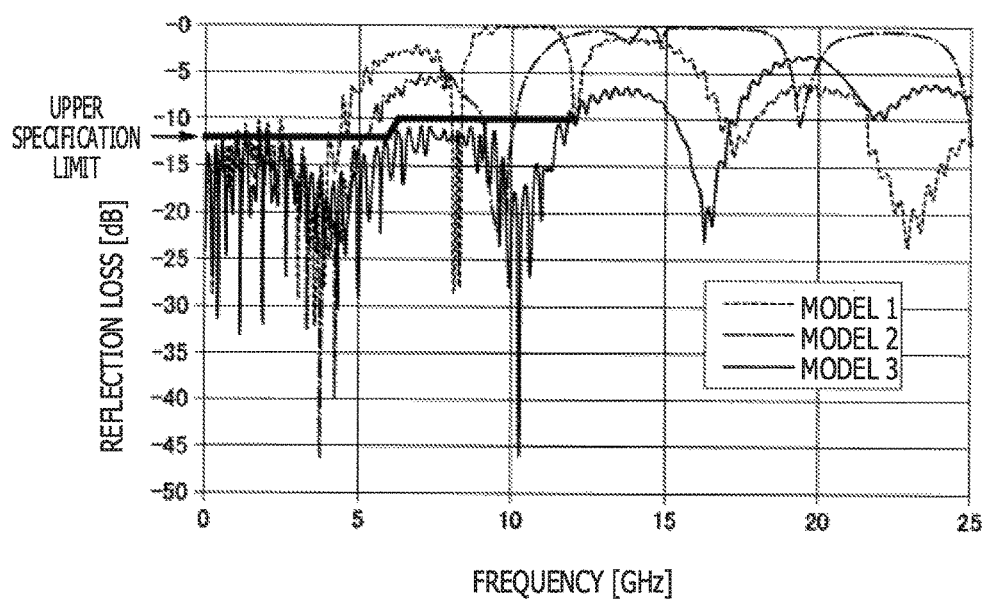
FIG. 12 is a graph representing relation between frequency of transmission signals in models 1 to 3 and reflection loss, which is acquired by simulation.

FIG. 12 is a graph representing relation between frequency of transmission signals in the model 1 to model 3 and reflection loss, which is acquired by simulation. FIG. 12 illustrates an upper specification limit of reflection loss in Serial Attached SCSI (SAS) 12 Gbps. As illustrated in FIG. 12, the model 1 having the largest total stub length exhibits the largest reflection loss, and the model 3 having the smallest total stub length exhibits the smallest reflection loss. Only in the model 3, reflection loss falls below the upper specification limit, and in the models 1 and 2, reflection loss exceeds the upper specification limit.

Figure 13:
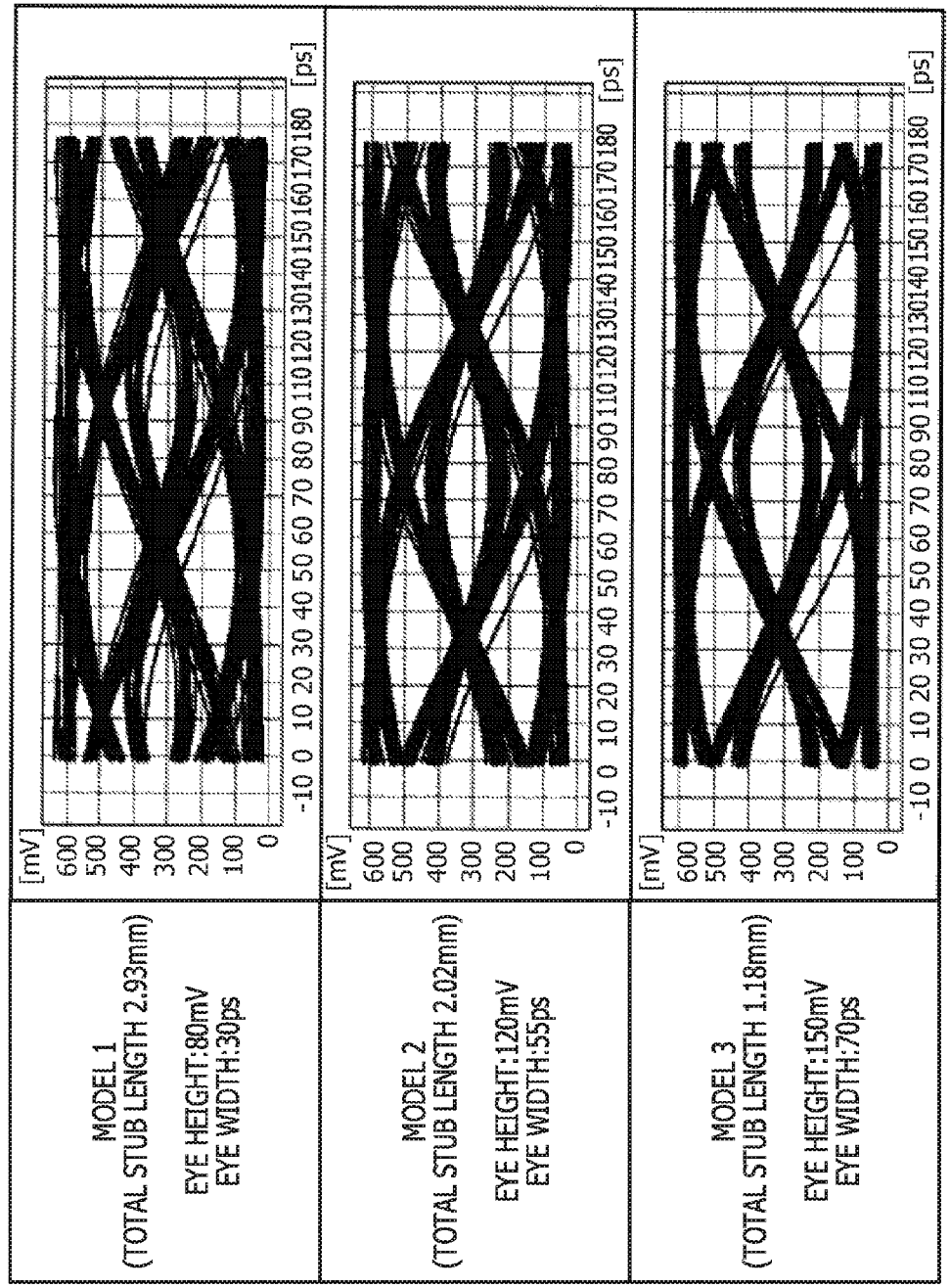
FIG. 13 is an eye diagram corresponding to the models 1 to 3.

FIG. 13 is an eye diagram corresponding to the models 1 to 3. In the eye diagram illustrated in FIG. 13, a horizontal axis represents time, and a vertical axis represents voltage. The eye diagram is created by sampling waveforms of a transmission signal for a relatively long period, and superimposing the waveforms to be displayed. As an opening width (Eye Height) in the voltage-axis direction and an opening width (Eye Width) in the time-axis direction of the eye pattern at the center of waveforms are larger, transmission performance is higher. The opening width (Eye Height) in the voltage-axis direction of 84 mV or more, and the opening width (Eye Width) in the time-axis direction of 30 ps or more are used as a standard for determining the performance of signal transmission based on the SAS 12 Gbps.

In an eye pattern in the model 1, the opening width (Eye Height) in the voltage-axis direction was 80 mV, and the opening width (Eye Width) in the time-axis direction is 30 ps, which do not satisfy the determination standard. In an eye pattern in the model 2, the opening width (Eye Height) in the voltage-axis direction is 120 mV, and the opening width (Eye Width) in the time-axis direction is 55 ps, which satisfy the determination standard. In an eye pattern in the model 3, the opening width (Eye Height) in the voltage-axis direction is 150 mV, and the opening width (Eye Width) in the time-axis direction is 70 ps, which satisfy the determination standard. As described above, it was confirmed that as the total stub length was smaller, both the opening width in the voltage-axis direction and the opening width in the time-axis direction in the eye pattern were larger, and transmission performance was higher.

Figure 14:
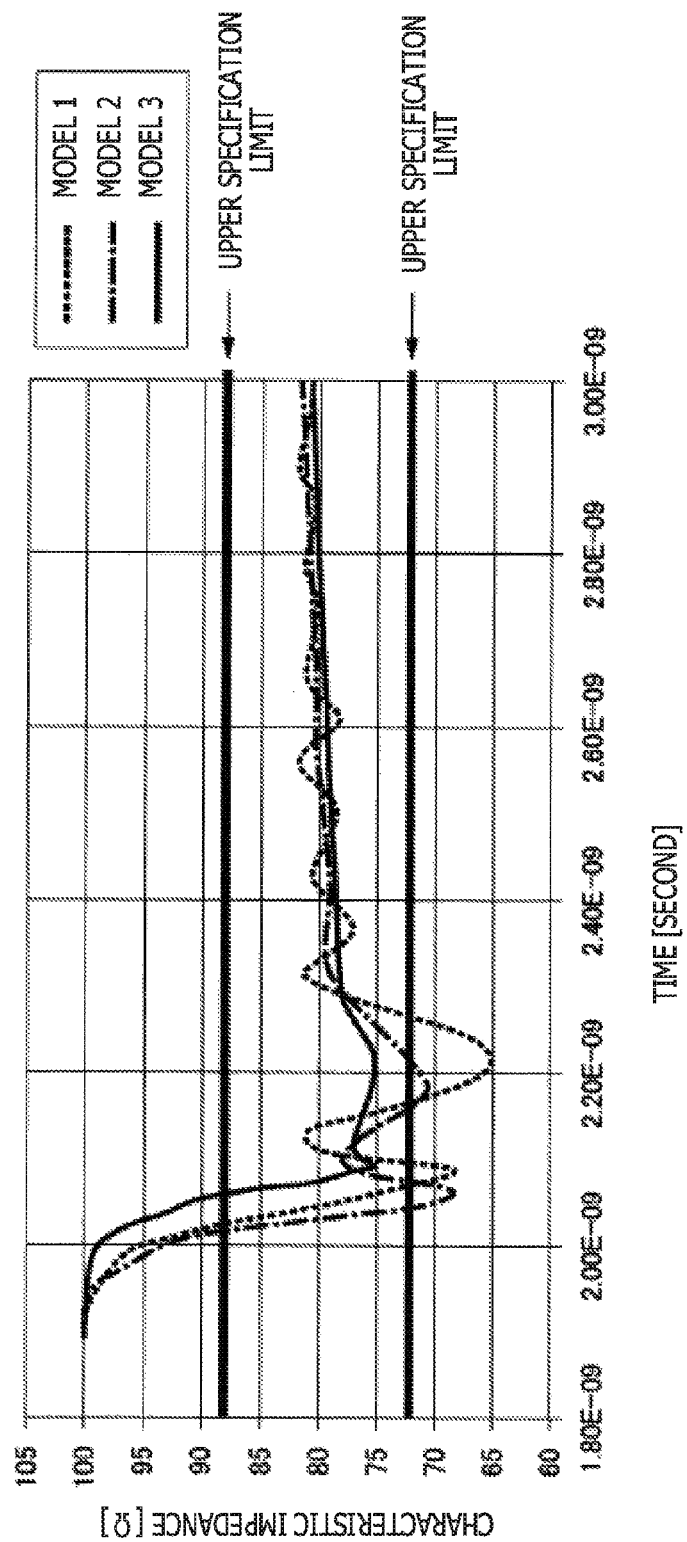
FIG. 14 is a graph illustrating characteristic impedance (differential impedance) of signal transmission paths in the models 1 to 3 by simulation.

FIG. 14 is a graph illustrating characteristic impedance (differential impedance) of signal transmission paths in the models 1 to 3 by simulation. In the graph, a horizontal axis represents time, and a vertical axis represents characteristic impedance (differential impedance). Time in horizontal axis corresponds to position in the signal transmission path.

In each of the models, the characteristic impedance of the wires 110A and 110B is about 80Ω. In this case, the characteristic impedance of portions other than the wires 110A and 110B in the signal transmission path (connectors 300A, 300B, and vias 200A, 201A, 200B, and 201B) is preferably, 80 Ω±10%, that is, 72Ω or more and 88Ω or less. In the model 1 and the model 2, the characteristic impedance in the signal transmission path falls without the above-mentioned range. In the model 3 having the smallest total stub length, the characteristic impedance in the signal transmission path falls within the range of 72Ω or more and 88Ω or less.

Based on the simulation results, to achieve the transmission rate of 12 Gbps, it is preferable that the total stub length in each via formed in the circuit board be about 1 mm or less.

Figure 15:
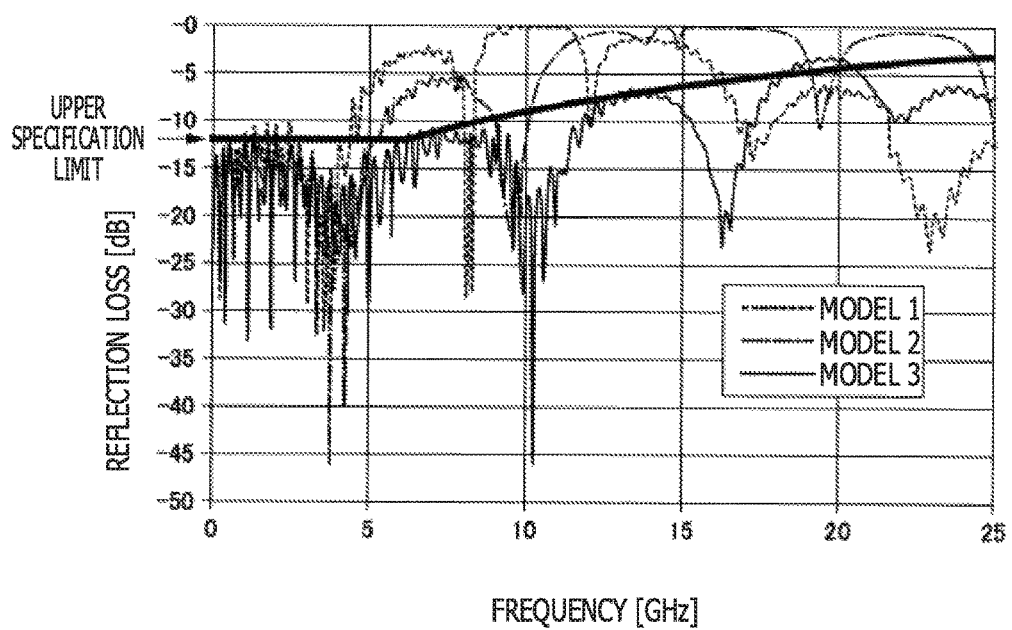
FIG. 15 is a view in which an upper specification limit of reflection loss at a transmission rate of 25 Gbps stipulated in the OIF-CEI-3.1 Implementation Agreement is written into the graph of reflection loss in FIG. 12.

FIG. 15 is a view in which an upper specification limit of reflection loss at a transmission rate of 25 Gbps stipulated in the OIF-CEI-3.1 Implementation Agreement made by the optical internetworking forum (OIF) is written into the graph of reflection loss in FIG. 12. As illustrated in FIG. 15, when the transmission rate of 25 Gbps is set as a target, even in the model 3 having the smallest total stub length among the three models, reflection loss exceeds the upper specification limit.

Figure 16:
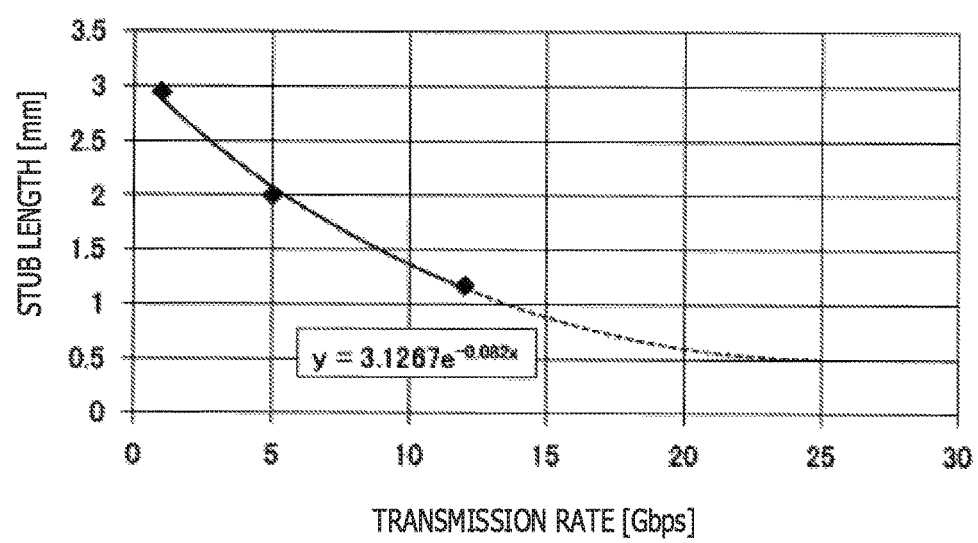
FIG. 16 is a graph illustrating relation between transmission rate and total stub length.

FIG. 16 is a graph illustrating relation between transmission rate and total stub length. In the graph in FIG. 16, a horizontal axis represents transmission rate, and a vertical axis is a standard of a maximum value of the total stub length for achieving the transmission rate of interest. Each plot in the drawing represents an actual value. That is, the total stub length of about 3 mm or less in each via may address a transmission rate of 1 Gbps, and the total stub length of about 2 mm or less in each via may address a transmission rate of 5 Gbps. Further, the total stub length of about 1 mm or less in each via may address a transmission rate of 12 Gbps. An approximate curve (y=3.1267e−0.082x) indicating relation between transmission rate and total stub length may be derived from these actual results. The total stub length for achieving the transmission rate of 25 Gbps may be derived as 0.5 mm from an extension of the approximate curve, which is represented by a broken line in FIG. 16.

The validity of the total stub length (0.5 mm) corresponding to the transmission rate of 25 Gbps, which is derived as described above, is verified. A characteristic impedance (differential impedance) Zdiff of a pair of vias forming a differential transmission line may be represented by following Expression (1): (Citation: Relative Permittivity Variation Surrounding PCB Via Hole Structures, Signal Propagation on Interconnects, 2008. SPI 2008. 12th IEEE Workshop on, Issue Date: 12-15 May 2008, Written by: Simonovich, L.).

$$Zdiff = \frac{120[ohm]}{\sqrt{Dk}} \ln\left(\frac{s}{D} + \sqrt{\left(\frac{s}{D}\right)^2 - 1}\right), \quad (1)$$

Figure 17:
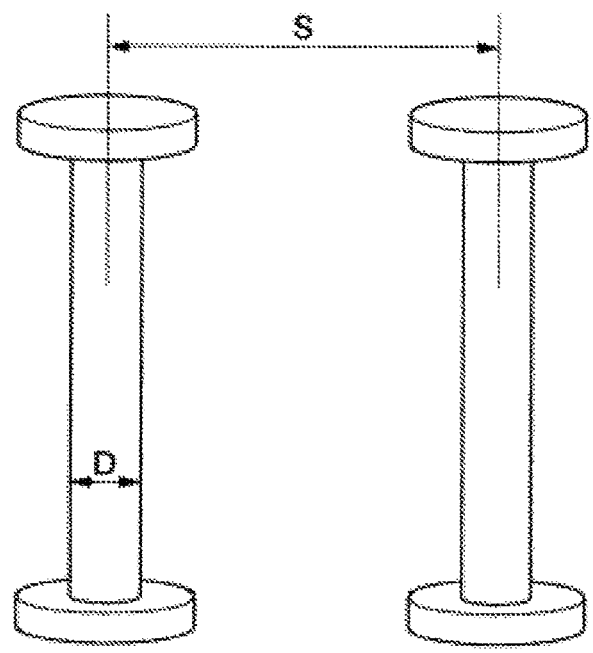
FIG. 17 is a diagram of a model of a pair of vias corresponding to Expression (1)

FIG. 17 is a diagram of a model of a pair of vias corresponding to Expression (1). In the Expression (1), s denotes a distance between centers of the pair of vias. In Expression (1), D denotes a diameter [mil] (1 mil=0.0254 mm) of a through hole in each via. In Expression (1), Dk denotes effective dielectric constant of the pair of vias, and may be expressed as Expression (2):

$$Dk = \left[\frac{c}{4*\text{Stub\_length}*f}\right]^2 \quad (2)$$

In Expression (2), c denotes speed of light (3×108 [m/s]). In Expression (2), Stub_length denotes a length of stub (total stub length) [m]. In Expression (2), f denotes ¼ wavelength frequency [Hz] equivalent to a half of Nyquist frequency [Hz]. Nyquist frequency [Hz] is a frequency expressed corresponding to transmission rate [bps], and for example, a transmission rate of 2 Gbps corresponds to a Nyquist frequency of 1 GHz.

Table 1 indicates values of characteristic impedance Zdiff of the vias, which correspond to the total stub lengths for achieving transmission rates concerned and acquired using Expression (1) and Expression (2).

TABLE 1

| Transmission rate | Total stub length | Through hole diameter D | Via center distance S | Effective dielectric constant Dk | Characteristic impedance Zdiff |
|---|---|---|---|---|---|
| 5 Gbps | 2 mm | 0.45 mm | 1.3 mm | 9 | 68.9 Ω |
| 12 Gbps | 1 mm | 0.45 mm | 1.3 mm | 6.25 | 82.69 Ω |
| 25 Gbps | 0.5 mm | 0.45 mm | 1.3 mm | 5.76 | 86 Ω |

In Expression (1), the through hole diameter D is 0.45 mm, and a center distance S between vias is 1.3 mm. In the commercially available connector, even when the target transmission rate varies, the width and pitch of a connector pin is substantially equal. Thus, in different transmission rates, the through hole diameter D and the via center distance s are same. According to Expression (1) and Expression (2), in the case of a transmission rate of 5 Gbps and a total stub length of 2 mm, the via characteristic impedance is 68.9Ω. In the case of a transmission rate of 12 Gbps, and a total stub length of 1 mm, the via characteristic impedance is 82.69Ω. In the case of a transmission rate of 25 Gbps and a total stub length of 0.5 mm, the via characteristic impedance is 86Ω. As such, a value close to a target value of 100Ω of the via characteristic impedance may be acquired in the case of the transmission rate of 25 Gbps and the total stub length of 0.5 mm. This demonstrates the validity of the fact that the total stub length for achieving the transmission rate of 25 Gbps derived from the approximate curve in FIG. 16 is 0.5 mm or less.

Figure 18A:
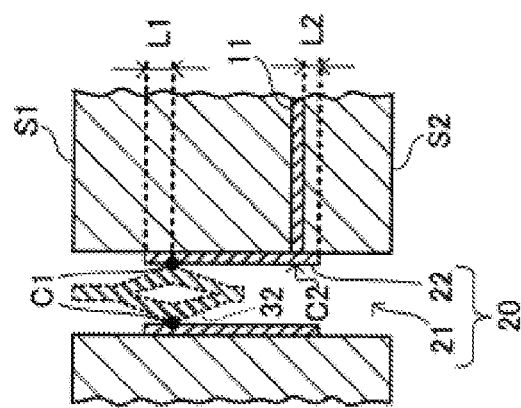
FIG. 18A is a sectional view illustrating the vicinity of the via of the circuit board.
Figure 18B:
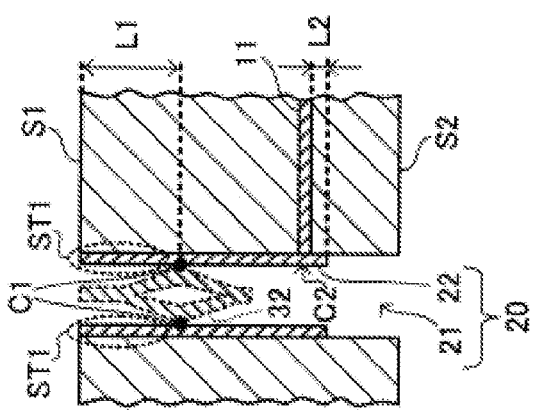
FIG. 18B is a sectional view illustrating the vicinity of the via of the circuit board.

The inventors of the disclosure found as described below the structure of each via formed in the circuit board, which achieved the total stub length of 0.5 mm or less. In the configuration of the via 20 illustrated in FIG. 18A, to decrease the length L2 of the stub ST2 near the back surface S2 of the circuit board, as illustrated in FIG. 18B, a part or whole of the stub ST2 may be removed by back drilling. To decrease the length L1 of the stub ST1 near the mounting surface S1 of the circuit board, the positions of the contact portions C1 where the connector pin 32 contacts the conductor 22 are shifted to the mounting surface S1. However, when a distance between the contact portions C1 and the mounting surface S1 is excessively decreased, the connector pin 32 easily escapes from the through hole 21 to degrade stability of mechanical and electrical connection between the connector and the circuit board. In consideration of stability of connection between the connector and the circuit board, the distance between the contact portions C1 and the mounting surface S1 is preferably, 1 mm or more. However, when the contact portions C1 are disposed at the positions of 1 mm or more from the mounting surface S1, the total stub length may not be 0.5 mm or less.

Figure 18C:
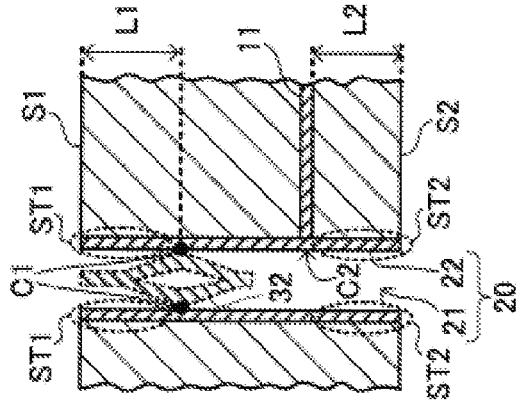
FIG. 18C is a sectional view illustrating the vicinity of the via of the circuit board.

Thus, the inventors of the disclosure found the following method of decreasing the length L1 of the stub ST1 near the mounting surface S1 while keeping the distance between the contact portions C1 and the mounting surface S1 1 mm or more. That is, the inventors found, as illustrated in FIG. 18C, removing at least a part of a portion of the conductor 22, which extends between the contact portions C1 and the mounting surface S1. The length L1 from the contact portions C1 to one end of the conductor 22 and the length L2 from the wire connecting portion C2 to the other end of the conductor 22 are adjusted by removing both the end near the mounting surface S1 and the end near the back surface S2 of the conductor 22. Accordingly, regardless of the positions of the contact portions C1, the total stub length may be reduced to 0.5 mm or less, achieving the transmission rate of 25 Gbps.

EXAMPLE

Figure 19:
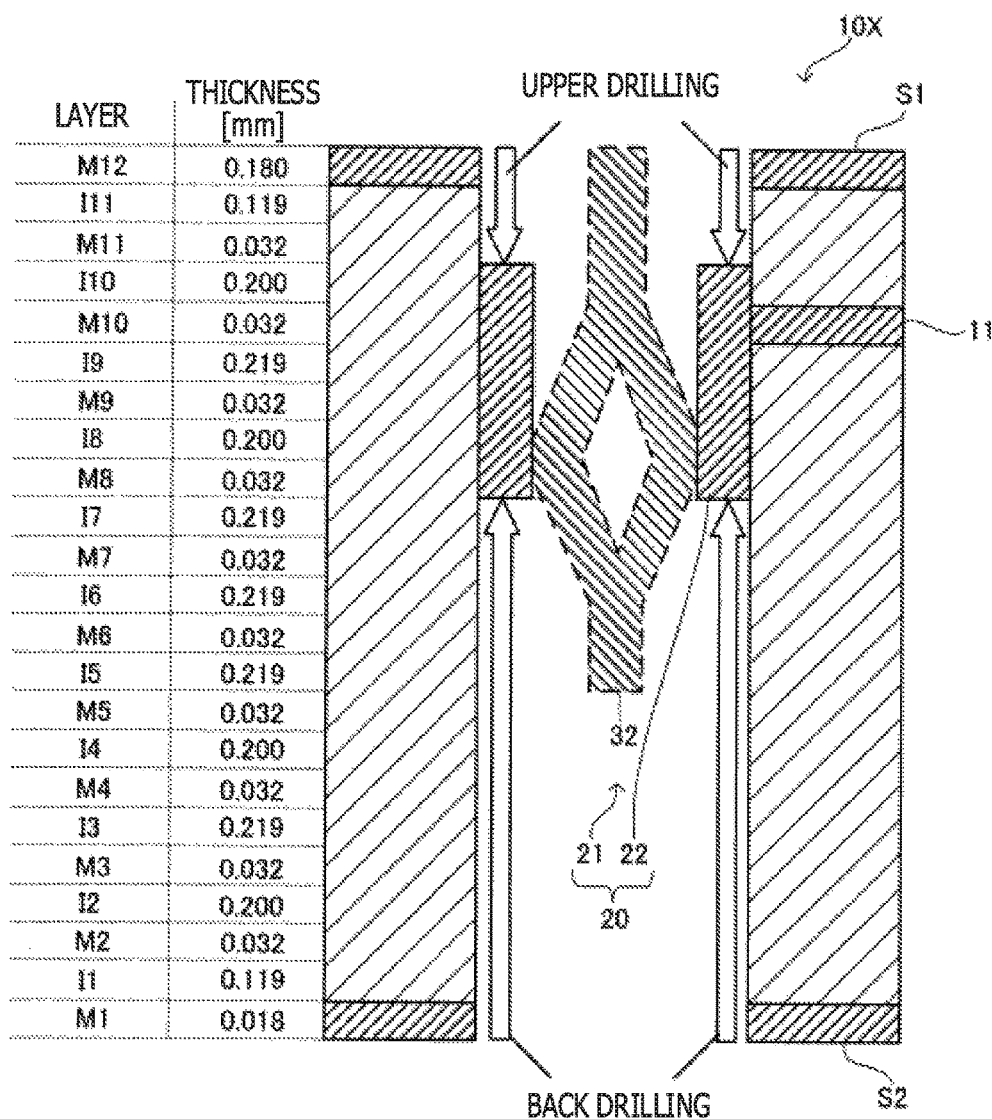
FIG. 19 is a sectional view illustrating the vicinity of the via of the circuit board according to an embodiment of the disclosed technique.

The circuit board according to an embodiment of the disclosed technique and a circuit board in a comparative example were actually manufactured, and signal transmission performance using the circuit boards was evaluated. FIG. 19 is a view illustrating configuration of an actually manufactured circuit board 10X according to the embodiment of the disclosed technique. The circuit board 10X includes wiring layers M1 to M12 and insulator layers I1 to I11. The circuit board 10X has a laminated structure in which the wiring layers and the insulator layers are alternately laminated.

FIG. 19 illustrates thickness of each layer. The wire 11 is disposed in the wiring layer M10 that is a tenth wiring layer from the back surface S2 of the circuit board 10X, and is connected to the conductor 22 that covers the inner wall surface of the through hole 21. The connector pin 32 inserted into the through hole 21 contacts with the conductor 22 at a position in the vicinity of the interface between the wiring layer M8 and the insulator layer 18 in the depth direction. The conductor 22 is partially removed by back drilling in which a drill is inserted from the back surface S2 of the circuit board 10X to dispose the end of the conductor 22 near the back surface S2 at a position in the vicinity of the interface between the insulator layer 17 and the wiring layer M8 in the depth direction. Further, the conductor 22 is partially removed by upper drilling in which a drill is inserted from the mounting surface S1 of the circuit board 10X to dispose the end of the conductor 22 near the mounting surface S1 at a position in the vicinity of the interface between the insulator layer I10 and the wiring layer M11 in the depth direction. A length of the conductor 22 after back drilling and upper drilling was set to about 0.5 mm. That is, the total stub length in each via 20 formed in the circuit board 10X is 0.5 mm or less.

In contrast, a circuit board in a comparative example (not illustrated) is subjected to only back drilling in each via 20 as in the circuit board 10X without performing upper drilling. That is, the total stub length in each via of the circuit board in the comparative example is larger than the total stub length in each via of the circuit board 10X according to the embodiment of the disclosed technique.

Figure 20:
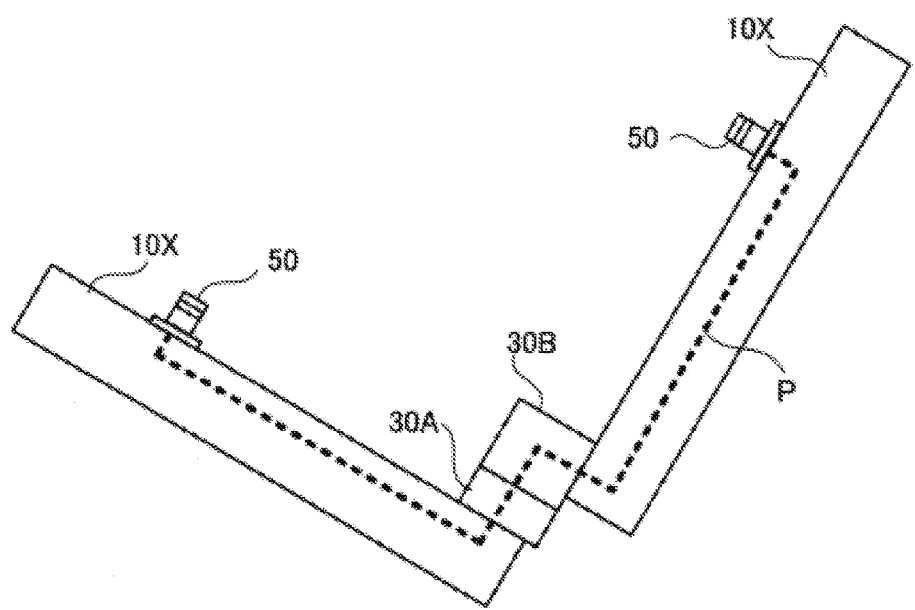
FIG. 20 is a view illustrating a structure for evaluating transmission performance, which is configured by combining two circuit boards according to the embodiment of the disclosed technique.

The two circuit boards 10X having the configuration described above were prepared, and as illustrated in FIG. 20, a transmitter-receiver 50 for transmitting and receiving a signal was mounted on each of the circuit boards 10X, and the two circuit boards 10X were interconnected using the connectors 30A and 30B. Then, reflection loss generated when a signal is transmitted between the transmitter-receivers 50 via the signal transmission path P including the internal wires of the connectors 30A, 30B, and the wire 11 and the vias 20 in the circuit boards 10X was measured. Further, reflection loss of the circuit board in the comparative example was measured in the same way.

Figure 21:
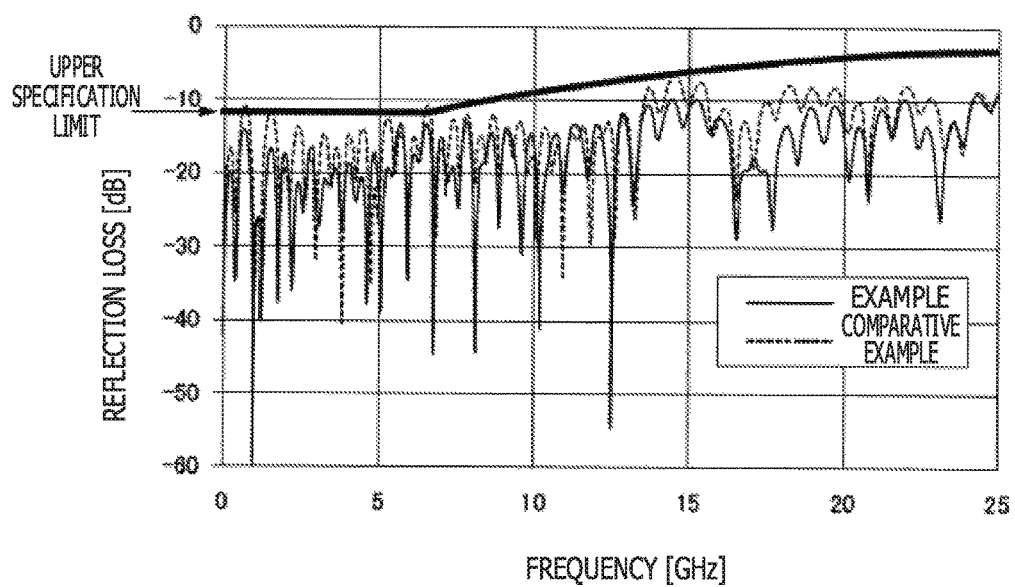
FIG. 21 is a graph illustrating actual values of reflection loss in the case of using the circuit board according to the embodiment of the disclosed technique and a circuit board according to a comparative example.

FIG. 21 is a graph illustrating actual values of reflection loss in the case of using the circuit board 10X according to the embodiment of the disclosed technique and the circuit board in the comparative example. FIG. 21 illustrates the upper specification limit of reflection loss at the transmission rate of 25 Gbps stipulated in the OIF-CEI-3.1 Implementation Agreement. As illustrated in FIG. 21, in the circuit board that is not subjected to upper drilling in the comparative example, a frequency range exceeding the upper specification limit is found. In the circuit board 10X according to the embodiment of the disclosed technique, which is subjected to back drilling and upper drilling and includes vias having a total stub length of 0.5 mm or less, reflection loss falls below the upper specification limit in the entire range up to frequency of 25 GHz.

Figure 22A:
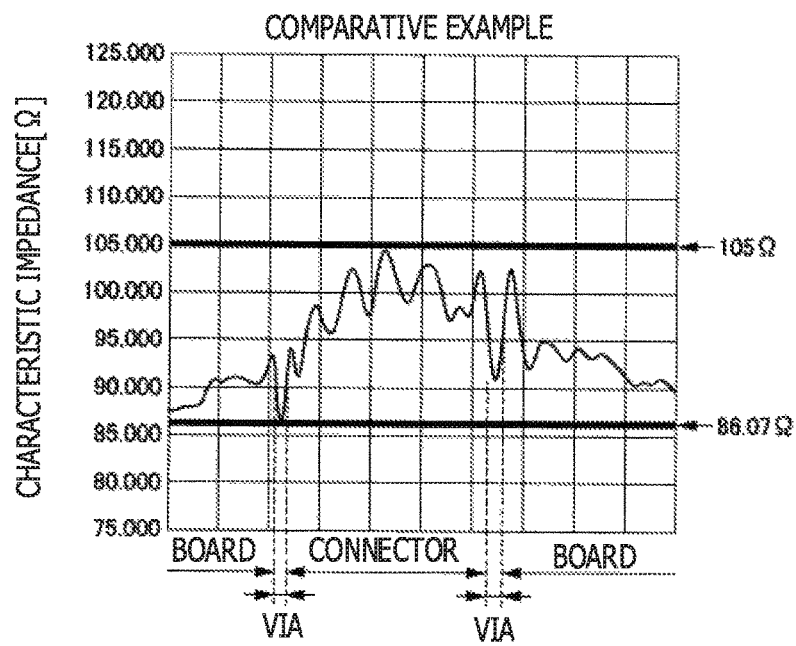
FIG. 22A is a graph illustrating actual values of characteristic impedance (differential impedance) of a signal transmission path in the circuit board in the comparative example.
Figure 22B:
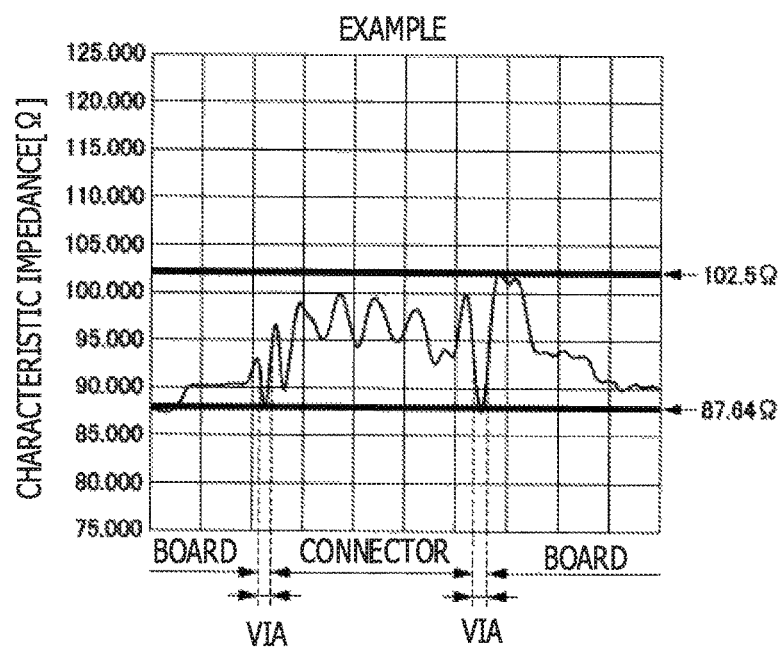
FIG. 22B is a graph illustrating actual values of characteristic impedance (differential impedance) of a signal transmission path in the circuit board according to the embodiments of the disclosed technique.

FIG. 22A is a graph illustrating actual values of characteristic impedance (differential impedance) in a signal transmission path in the circuit board in the comparative example. FIG. 22B is a graph illustrating actual values of characteristic impedance (differential impedance) in a signal transmission path in the circuit board 10X according to the embodiment of the disclosed technique. In each of the graphs, a horizontal axis represents time, and a vertical axis represents characteristic impedance (differential impedance). Time in the horizontal axis corresponds to position in the signal transmission path, and FIGS. 22A and 22B illustrate position in the signal transmission path.

A minimum value of the characteristic impedance of the signal transmission path in the circuit board in the comparative example is 86.07Ω, and a maximum value is 105Ω. That is, a range of fluctuation of the characteristic impedance of the signal transmission path in the circuit board in the comparative example is 18.93Ω. A minimum value of the characteristic impedance of the signal transmission path in the circuit board 10X according to the embodiment of the disclosed technique is 87.64Ω, and a maximum value is 102.5Ω. That is, a range of fluctuation of the characteristic impedance of the signal transmission path in the circuit board 10X according to the embodiment of the disclosed technique is 14.86Ω. As described above, the range of fluctuation of the characteristic impedance of the signal transmission path is smaller in the circuit board 10X according to the embodiment of the disclosed technique having a smaller total stub length than in the circuit board in the comparative example.

As apparent from the above description, as compared to the case in which only conventional back drilling is applied, the circuit boards 10 and 10X according to the embodiment of the disclosed technique may reduce reflection loss caused by stubs. Moreover, since the total stub length in each via is set to 0.5 mm or less, for example, the circuit boards 10 and 10X according to the embodiment of the disclosed technique may support high-speed transmission of, for example, 25 Gbps.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A circuit board comprising:
    a first surface and a second surface opposite to the first surface;
    a through hole extending between the first surface and the second surface;
    a conductor covering an inner wall surface of the through hole, a first end and a second end of the conductor being terminated inside the through hole; and
    a wire connected to the conductor, wherein
    a sum of a length from a contact portion where the conductor contacts a connector pin inserted in the through hole to the first end of the conductor, and a length from a wire connecting portion where the conductor is connected to the wire to the second end of the conductor is 0.5 mm or less.

2. The circuit board according to claim 1, wherein
    the contact portion and the wire connecting portion are disposed at the same position in a depth direction in the through hole.

3. The circuit board according to claim 1, wherein
    the contact portion is disposed at a position of 1 mm or more from one of the first surface and the second surface from which the connector pin is inserted.

4. The circuit board according to claim 1, further comprising:
    a plurality of wiring layers including a wiring layer having the wire formed therein; and
    a plurality of insulator layers, wherein
    the wiring layers and the insulator layers are alternately laminated.

5. A method of manufacturing a circuit board, the method comprising:
    forming a laminated board in which a wiring layer having a wire and an insulator layer are laminated;
    forming a through hole extending between first and second surfaces of the laminated board, the second surface being opposite to the first surface;
    forming a conductor on an inner wall surface of the through hole such that the conductor is connected to the wire; and
    removing an end portion of the conductor near the first surface and an end portion of the conductor near the second surface such that a sum of a length from a contact portion where the conductor contacts a connector pin inserted in the through hole to a first end of the conductor, and a length from a wire connecting portion where the conductor is connected to the wire to a second end of the conductor is 0.5 mm or less.

6. The manufacturing method according to claim 5, further comprising
    removing the end portion of the conductor near the first surface and the end portion of the conductor near the second surface by inserting a drill from the first surface and the second surface.

7. An electronic device comprising:
a first circuit board having a first wire;
a second circuit board having a second wire; and
a connector connecting the first wire to the second wire;
   wherein
each of the first circuit board and the second circuit board includes:
a first surface and a second surface opposite to the first surface;
a through hole extending between the first surface and the second surface; and
a conductor covering an inner wall surface of the through hole, a first end and a second end of the conductor being terminated inside the through hole, the conductor being connected to the corresponding one of the first wire and the second wire, and
in each of the first circuit board and the second circuit board, a sum of a length from a contact portion where the conductor contacts a connector pin inserted into the through hole to the first end of the conductor, and a length from a wire connecting portion where the conductor is connected to the first wire or the second wire to the second end of the conductor is 0.5 mm or less.

8. The electronic device according to claim 7, wherein the contact portion and the wire connecting portion are disposed at the same position in a depth direction in the through hole in at least one of the first circuit board and the second circuit board.

9. The electronic device according to claim 7, wherein the contact portion is disposed at a position of 1 mm or more from one of the first surface and the second surface from which the connector pin is inserted in at least one of the first circuit board and the second circuit board.

10. The electronic device according to claim 7, wherein the first circuit board includes a plurality of insulator layers and a plurality of wiring layers including a wiring layer having the first wire formed therein, the wiring layers and the insulator layers being alternately laminated, and
the second circuit board includes a plurality of insulator layers and a plurality of wiring layers including a wiring layer having the second wire formed therein, the wiring layers and the insulator layers being alternately laminated.

* * * * *